United States Patent
Horng et al.

(10) Patent No.: US 11,914,940 B2
(45) Date of Patent: Feb. 27, 2024

(54) SYSTEM FOR DESIGNING A SEMICONDUCTOR DEVICE, DEVICE MADE, AND METHOD OF USING THE SYSTEM

(71) Applicant: TAIWAN SEMICONDUCTOR MANUFACTURING COMPANY, LTD., Hsinchu (TW)

(72) Inventors: Jaw-Juinn Horng, Hsinchu (TW); Wen-Shen Chou, Hsinchu (TW); Yung-Chow Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 15 days.

(21) Appl. No.: 17/200,366

(22) Filed: Mar. 12, 2021

(65) Prior Publication Data

US 2021/0200929 A1 Jul. 1, 2021

Related U.S. Application Data

(62) Division of application No. 16/022,680, filed on Jun. 28, 2018, now Pat. No. 10,949,598, which is a
(Continued)

(51) Int. Cl.
G06F 30/398 (2020.01)
G06F 30/392 (2020.01)

(52) U.S. Cl.
CPC .......... *G06F 30/398* (2020.01); *G06F 30/392* (2020.01)

(58) Field of Classification Search
CPC .. G06F 30/398; G06F 30/367; G06F 2119/18; G06F 30/392; G06F 30/33;
(Continued)

(56) References Cited

U.S. PATENT DOCUMENTS 6,988,253 B1* 1/2006 Lipton ................. G06F 30/392
716/112
2002/0100005 A1 7/2002 Anderson et al.
(Continued)

FOREIGN PATENT DOCUMENTS

CN 1585110 2/2005
CN 101409281 4/2009

OTHER PUBLICATIONS

Office Action dated Aug. 3, 2018 from corresponding application No. CN 201610193186.6.
(Continued)

*Primary Examiner* — Binh C Tat
(74) *Attorney, Agent, or Firm* — Hauptman Ham, LLP

(57) ABSTRACT

A semiconductor device includes an edge active cell, an inner active cell and a middle active cell. The edge active cell is located near an edge of the semiconductor device. The edge active cell includes a plurality of fingers. The inner active cell is adjacent to the edge active cell toward a central portion of the semiconductor device. The inner active cell includes a plurality of fingers and at least one of the plurality of fingers of the edge active cell is electrically connected to at least one of the plurality of fingers of the inner active cell. The middle active cell is located near the central portion of the semiconductor device. The middle active cell includes a plurality of fingers and each of the fingers of the middle active cell is electrically connected to each other.

20 Claims, 4 Drawing Sheets

Related U.S. Application Data division of application No. 14/879,692, filed on Oct. 9, 2015, now Pat. No. 10,026,725, which is a division of application No. 13/569,717, filed on Aug. 8, 2012, now Pat. No. 9,158,883.

(58) Field of Classification Search
CPC .............. G06F 2111/20; G06F 2111/04; G06F 30/327; G06F 2111/12; G06F 30/31; G06F 30/38; G06F 2111/08; G06F 2119/12; G06F 30/20; G06F 30/30; G06F 30/39; G06F 2119/06; G06F 30/394; G06F 30/23; G06F 30/36; G06F 17/18; G06F 2119/02; G06F 2119/10; G06F 30/3308; G06F 2119/04; G06F 30/00; G06F 18/24; G06F 2117/12; G06F 30/27; G06F 30/3953; G03F 1/36; G03F 1/26; G03F 1/84; G03F 1/82; G03F 7/0002; G03F 7/70441; G03F 7/70625; H01L 29/792; H01L 29/40117; H01L 27/0688; H01L 27/0207; H01L 24/83; H01L 23/528
USPC .................................. 716/118–125
See application file for complete search history.

(56) References Cited

U.S. PATENT DOCUMENTS

| | | |
|---|---|---|
| 2005/0044522 A1 | 2/2005 | Maeda |
| 2005/0076316 A1 | 4/2005 | Pierrat et al. |
| 2005/0251771 A1 | 11/2005 | Robles |
| 2008/0005704 A1 | 1/2008 | Miloslavsky et al. |
| 2010/0203430 A1 | 8/2010 | Ye et al. |
| 2010/0306720 A1 | 12/2010 | Pikus et al. |
| 2011/0018508 A1 | 1/2011 | Ueunten |
| 2011/0145772 A1 | 6/2011 | Pikus |
| 2014/0040836 A1 | 2/2014 | Chou et al. |
| 2014/0042585 A1* | 2/2014 | Peng ..................... G06F 30/398 716/112 |
| 2015/0302136 A1* | 10/2015 | Chen ....................... G06F 30/20 716/52 |

OTHER PUBLICATIONS

Office Action dated Mar. 21, 2019 from corresponding application No. CN 201610193186.6.

\* cited by examiner

SYSTEM FOR DESIGNING A SEMICONDUCTOR DEVICE, DEVICE MADE, AND METHOD OF USING THE SYSTEM

PRIORITY CLAIM

The present application is a divisional of U.S. application Ser. No. 16/022,680, filed Jun. 28, 2018, now U.S. Pat. No. 10,949,598, issued Mar. 16, 2021, which is a divisional of U.S. application Ser. No. 14/879,692, filed Oct. 9, 2015, now U.S. Pat. No. 10,026,725, issued Jul. 17, 2018, which is a divisional of U.S. application Ser. No. 13/569,717, filed Aug. 8, 2012, now U.S. Pat. No. 9,158,883, issued Oct. 13, 2015, which are incorporated herein by reference in their entireties.

BACKGROUND

During semiconductor manufacturing, a chemical mechanical polishing (CMP) process is used to planarize a surface of a semiconductor device. In some instances, the CMP process causes a gradient in a pattern density of the planarized surface to be formed across the planarized surface of the semiconductor device. The pattern density is a ratio of an area occupied by cells within a semiconductor device to a total area of the semiconductor device. In some instances, CMP processes result in dishing of the semiconductor device, meaning some cells of the semiconductor device are removed faster than other regions forming a gradient in the pattern density. The gradient is most pronounced near an exterior edge of the semiconductor device. Semiconductor devices which have a pattern density gradient exceeding a threshold value function improperly. To ensure a requisite number of functioning cells are formed in the semiconductor device, semiconductor devices are designed with dummy cells around an exterior edge where the pattern density gradient is most pronounced. These dummy cells increase the size of the semiconductor device without increasing functionality of the semiconductor device.

In another semiconductor device design process, a layout versus schematic (LVS) tool is used to compare a schematic design to a layout design. The layout design comprises a mask or masks having patterns formed therein which are used to form features of the schematic design. Once the LVS tool determines the layout design accurately corresponds to the schematic design, the dummy cells are inserted into the layout design to compensate for pattern density gradients. Following the insertion of the dummy cells, a design rule checking (DRC) tool determines whether the revised layout design violates any design rules, such as element size or spacing. If either the LVS tool or the DRC tool detects an error, the layout design is revised and the checking process restarts from the LVS tool.

DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are of course, merely examples and are not intended to be limiting.

Figure 1:
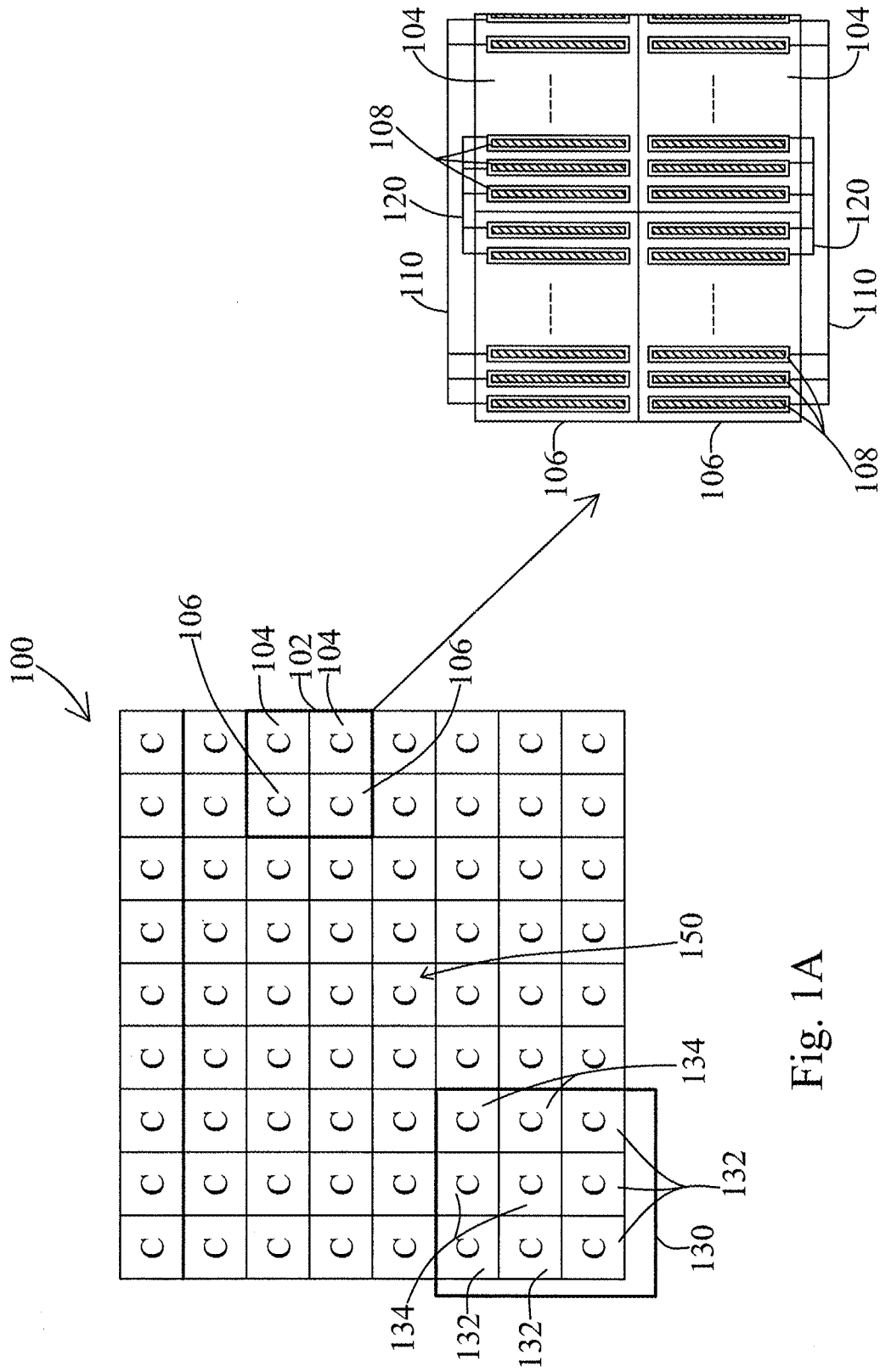
FIG. 1A is a top view of a semiconductor device according to one or more embodiments.
FIG. 1B is a top view of a portion of the semiconductor device of FIG. 2A according to one or more embodiments.

FIG. 1A is a top view of a semiconductor device 100. Semiconductor device 100 includes an array of cells C. In the depicted embodiment, each cell C includes 16 fingers. Fingers are a plurality of gate electrodes for a single transistor, where the plurality of gate electrodes connect to a common power signal. In some embodiments, each cell includes more or less than 16 fingers. In some embodiments, different cells have different number of fingers. A sub-array 102 of cells C is located at an exterior edge of semiconductor device 100. Sub-array 102 includes two cells 104 located adjacent to the exterior edge of semiconductor device 100 and two cells 106 located one row of cells separated from the exterior edge of semiconductor device 100.

FIG. 1B is a top view of sub-array 102 of semiconductor device 100. Several fingers 108 of cells 104 and 106 are depicted in FIG. 2B. In addition to cells 104 and 106, sub-array 102 also includes conductive lines 110 and 120. Conductive line 110 electrically connects at least one finger 108 from a portion of cells 106 located farthest from the exterior edge of semiconductor device 100 to at least one finger 108 from a portion of cells 104 located closest to the exterior edge of the semiconductor device. Conductive line 120 electrically connects at least one finger 108 from a portion of cells 106 closest to the exterior edge of semiconductor device 100 to at least one finger 108 of cells 104 farthest from the exterior edge of the semiconductor device. Electrically connecting fingers of adjacent cells results in a distributed layout style.

The distributed layout style compensates for pattern density gradients near the exterior edge of semiconductor device 100. The pattern density gradients near the exterior edge are more severe in comparison with pattern density gradients near a central portion 150 of semiconductor device 100. By electrically connecting fingers 108 of cell 106 to fingers 108 of cell 104, the electrical impact of the pattern density gradient at the exterior edge of semiconductor device 100 is shared between cells 104 having a higher pattern density gradient and cells 106 having a lower pattern density gradient. Sharing the electrical impact, using the distributed layout style, cells 104 are able to satisfy threshold tests for usability. In some embodiments, at least 25% of fingers 108 of cell 104 are electrically connected to fingers 108 in cell 106. In some instances, if less than 25% of finger 108 are electrically connected between cells 104 and 106, the shared electrical impact is insufficient to make cell 104 usable as an active cell in semiconductor device 100. In some embodiments, at most 50% of fingers 108 of cell 104 are electrically connected to fingers 108 in cell 106. If more than 50% of fingers 108 are connected between cells 104 and 106 the negative impact of the shared electrical impact on cell 106 reduces the performance of cell 106 below an acceptable level. Because cells 104 are usable, a size of semiconductor device 100 does not need to be increased by an additional layer of dummy cells to provide a sufficient buffer zone around the cells C to achieve the desired number of properly functioning active cells within semiconductor device 100. Semiconductor device 100 can therefore be reduced in size in comparison to a design which does not include the distributed layout style.

However, the distributed layout style does adversely impact cells 106. Due to the inclusion of the electrical connection to fingers closest to the exterior edge of cells 104 in the electrical connection of cells 106, the performance of cells 106 is degraded. As a number of fingers connected to between cells 104 and cells 106 increases, the adverse impact on cells 106 increases. In some embodiments, the pattern density gradient with respect to cells 106 increases by about 25% to about 50% due to the distributed layout. Despite the increased variation in cells 106, an overall performance of cells 106 remains within acceptable values. The distributed layout near the exterior edge of semiconductor device 100 therefore increases the number of usable cells without increasing the area of semiconductor device 100.

For a sub-array 130 which includes a corner of semiconductor device, the sub-array includes a larger number of cells to distribute the variation of edge cells 132 over a greater number of inner cells 134. For example, sub-array 130 is a three-by-three array at a corner of semiconductor device 100 which includes five edge cells 132 and four inner cells 134. By electrically connecting fingers of inner cells 134, the performance of edge cells 132 is increased to a usable level. By distributing the increased variation as a result of the distributed layout over a sufficient number of inner cells 134, the inner cells also remain usable. In some embodiments, dimensions of sub-array 130 are different than three-by-three. In some embodiments, sub-array 130 is not a square.

Cells C of semiconductor device 100 located near central portion 150 of the semiconductor device may not include the distributed layout. The distributed layout introduces a greater amount of complexity in designing and manufacturing of an interconnect structure for providing the operational voltage to semiconductor device 100. Near the exterior edge of semiconductor device 100, the increased complexity of the interconnect structure is acceptable because the size of the semiconductor device can be reduced. However, in some embodiments, near central portion 150, the distributed layout does not help to reduce the size of semiconductor device 100. In some embodiments, all fingers in cells C near central portion 150 are electrically connected within the same cell C. As a result, the interconnect structure near central portion 150 is simplified in comparison with cells connected in a distributed layout.

Figure 2:
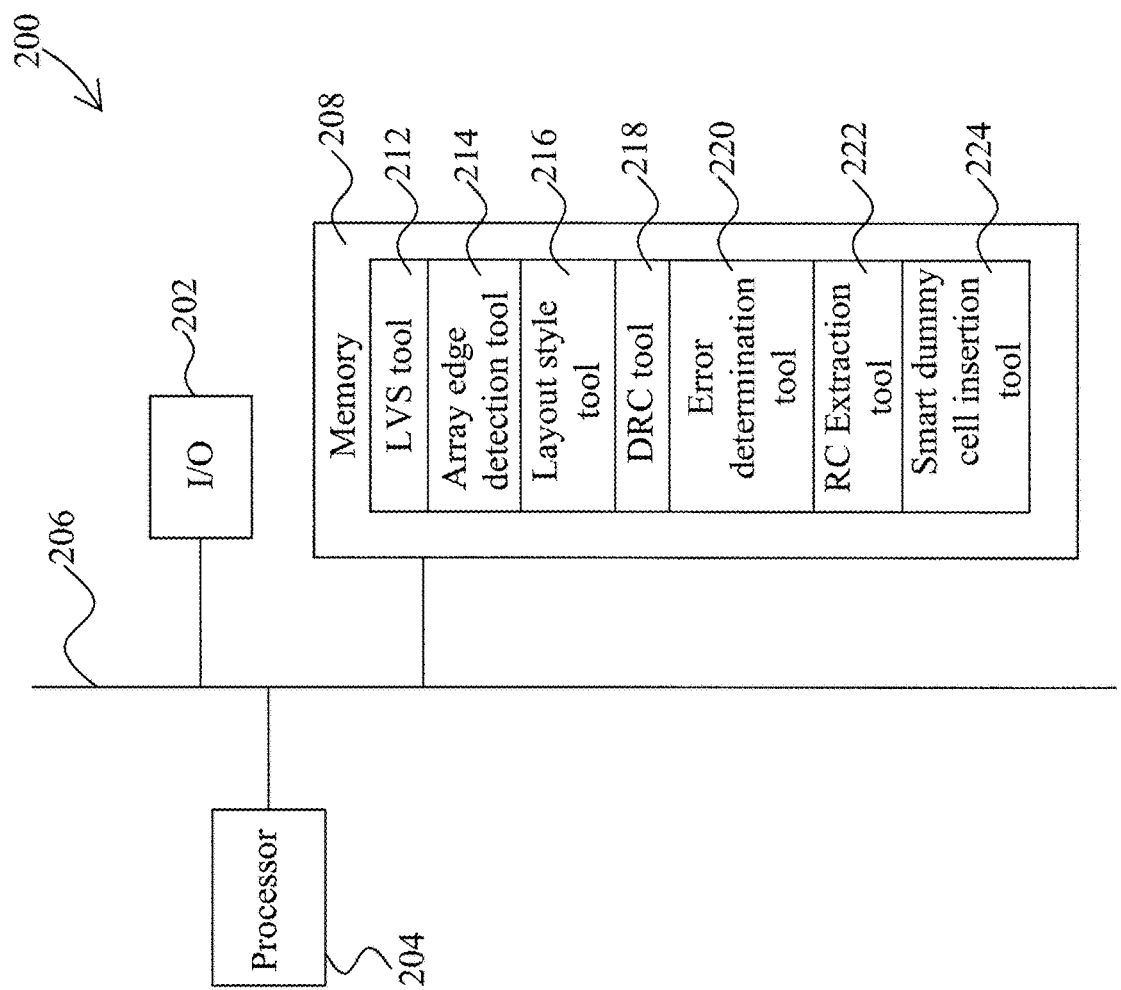
FIG. 2 is a block diagram of a semiconductor design system according to one or more embodiments.

FIG. 2 is a block diagram of a semiconductor design system 200. Semiconductor design system 200 includes an input/output (I/O) 202 connected to a processor 204 through a bus 206. A memory 208 is also connected to I/O 202 and processor 204 through bus 206. Memory 208 includes instructions for a layout versus schematic (LVS) tool 212, an array edge determination tool 214, a layout style determination tool 216, a design rule checking (DRC) tool 218, a gradient error detection tool 220, a resistance-capacitance (RC) extraction tool 222, and a smart dummy cell insertion tool 224. Each of these tools comprises a set of instructions for execution by the processor 204. In some embodiments, memory 208 is a mixed signal circuit.

Memory 208 comprises, in some embodiments, a random access memory (RAM) and/or other dynamic storage device and/or read only memory (ROM) and/or other mixed-signal circuits coupled to bus 206 for storing data and instructions to be executed by processor 204. Memory 208 is also used, in some embodiments, for storing temporary variables or other intermediate information during execution of instructions to be executed by processor 204.

Memory 208, such as a magnetic disk or optical disk, is provided, in some embodiments, and is coupled to bus 206 for storing data and/or instructions. I/O device 202 comprises an input device, an output device and/or a combined input/output device for enabling user interaction. An input device comprises, for example, a keyboard, keypad, mouse, trackball, trackpad, and/or cursor direction keys for communicating information and commands to the processor 204. An output device comprises, for example, a display, a printer, a voice synthesizer, etc. for communicating information to a user.

In some embodiments, a processor, e.g., processor 204, executes the instructions stored in memory 208. One or more of the memory 208, I/O device 202, and bus 206 is/are operable to receive design rules and/or other parameters for processing by processor 204. One or more of memory 208, I/O device 202, and bus 206 is/are operable to output results as determined by processor 204.

In some embodiments, one or more of the processes is/are performed by specifically configured hardware (e.g., by one or more application specific integrated circuits or ASIC(s)) which is/are provided) separate from or in lieu of the processor. Some embodiments incorporate more than one of the described processes in a single application specific integrated circuit (ASIC).

In some embodiments, the processes are instantiated as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

LVS tool 212 determines whether the layout design accurately corresponds to the schematic design. LVS tool 212 compares whether elements of the schematic design are accurately incorporated into the layout design. LVS tool 212 compares dimensions and a location of features of the schematic design to dimensions and a location of features on the layout design. By comparing the schematic design to the layout design, LVS tool 212 is able to determine whether the layout design incorporates all features of the schematic design and whether the features are precisely incorporated into the layout design.

Array edge detection tool 214 determines whether an exterior edge of the layout design includes active cells or dummy cells. An active cell is a cell which includes an electrical connection and performs a function for the semiconductor device to carry out a task. A dummy cell is a cell which is serves as a spacer and is not used by the semiconductor device to carry out the task. By determining whether the layout design includes dummy cells, semiconductor design system 200 determines whether additional dummy cells need to be inserted into the layout design to account for pattern density gradients at the exterior edge of the layout design. If the exterior edge of the layout design includes active edge cells, array edge detection tool 214 sends a signal to smart dummy cell insertion tool 224 to add dummy cells around the exterior edge. In some embodiments, if the exterior edge of the layout design includes dummy edge cells, array edge detection tool 214 sends a signal to smart dummy cell insertion tool 224 indicating additional dummy cell insertion is not necessary. In some embodiments, if the exterior edge of the layout design includes dummy edge cells, array edge detection tool 214 does not send a signal to smart dummy cell insertion tool 224 and the smart dummy cell insertion tool 224 and the smart dummy cell insertion tool is configured to insert additional dummy cells only when prompted. In some embodiments, array edge detection tool 214 comprises a computer aided design (CAD) program for recognizing the type of cells along an exterior edge of the layout design. In some embodiments, an identifying CAD layer is introduced to mark the edge of the active cell array. Cells which are outside the identifying CAD layer are determined to be dummy cells. In some embodiments, the CAD program uses the schematic design to determine which cells are used for carrying out the task of the semiconductor device. Cells which are outside the area of cells used for carrying out the task of the semiconductor device are determined to be dummy cells. The CAD program can also determine a number of rows of dummy cells.

Layout style tool 216 detects a layout style of the active cells in the semiconductor device. The layout style can be random, distributed, grouping or another suitable layout style. The layout style is determined by how the fingers of an active cell are electrically connected to receive an operating voltage. In some embodiments, layout style tool 216 examines an interconnect structure of the layout design to determine how fingers within the cells are electrically connected to one another. In some embodiments, layout style tool 216 determines whether the active edge cells include the distributed layout style. If the layout style tool 216 determines the active edge cells do not include the distributed layout style, the layout style tool 216 sends a signal to smart dummy cell insertion tool 224 indicating several rows of dummy cells are to be inserted. In some embodiments, if layout style tool 216 determines the active edge cells include the distributed layout style, the layout style tool 216 sends a signal to smart dummy cell insertion tool 224 indicating a single row of dummy cells is required for proper functionality. In some embodiments, if layout style tool 216 determines the active edge cells include the distributed layout style, the layout style tool 216 does not send a signal to smart dummy cell insertion tool 224 and the smart dummy cell insertion tool is configured to inset dummy cells only when prompted.

DRC tool 218 determines whether the layout design satisfies design rules. In some embodiments, the design rules include a minimum spacing between elements, minimum element size, pattern density gradient, or other design parameters. Using information from array edge detection tool 214 and layout style tool 216, DRC tool 218 examines each side of the semiconductor device beginning at the detected edge of active cells and extending a specified distance. In some embodiments, where the exterior edge of the semiconductor device has a distributed layout style, the specified distance is less than or equal to about 6 μm. The specified distance of 6 μm results from a decreased number of dummy cells surrounding cells C of semiconductor device 100. By using the distributed layout style, the specified distance is reduced with respect to other layout styles. A specified distance of greater than 6 μm unnecessarily increases an amount of time for DRC tool 218 to perform the determination. A specified distance of less than 6 μm, in some instances, would not provide a sufficiently accurate comparison to accurately determine compliance with the design rules. In some embodiments, where the exterior edge of the semiconductor device does not include a distributed layout style, the specified distance is up to about 20 μm.

If the gradient of the pattern density exceeds about 10% over the specified distance, DRC tool 218 determines an error exists as a result of pattern density gradient. If the pattern density gradient exceeds about 10%, the difference in cell performance between cells C located near the center of semiconductor device 100 and cells C located near an exterior edge of the semiconductor device is too great for the semiconductor device to function properly. In order to compensate for the pattern density gradient exceeding about 10%, additional layers of dummy cells would be added which increases the size of semiconductor device 100. In order to reduce the number of dummy cell layers a threshold for the pattern density gradient is set to about 10%. If the spacing or size is below a threshold value for a manufacturing process, DRC tool 218 determines an error exists as a result of spacing or size of a feature. If a design rule is violated, DRC tool 218 outputs an error signal indicating that the layout design contains an error and a type of error.

Error determination tool 220 receives the error signal from DRC tool 218 and determines whether the error is a result of a pattern density gradient problem. Error determination tool 220 identifies the error type encoded in the error signal and outputs an error message based on the error type. If the error is a result of pattern density gradient problems, error determination tool 220 outputs a message that a revised dummy cell design is required. If the error is not a result of pattern density gradient problems, error determination tool 220 outputs a message that a revised layout design is required.

If DRC tool 218 determines no error exists in the layout design, a message is sent to RC extraction tool 222 to cause the RC extraction tool 222 to perform an RC extraction based on the schematic design. In some embodiments, RC extraction tool 222 includes a simulation program with integrated circuit emphasis (SPICE) model tool. In some embodiments, RC extraction tool 222 simulates a performance of the schematic design using information such as feature size, spacing between features and materials to determine how the interaction between different components of the schematic design impact the performance of the overall design. RC extraction tool 222 outputs a signal indicating whether the schematic design satisfies constraints submitted to RC extraction tool 222 by a circuit designer. If RC extraction tool 222 determines the schematic design is acceptable, i.e., satisfies the constraints, the schematic design and layout design are prepared for manufacturing by taping out the layout design. Taping out is the process by which the mask or masks which form the layout design are physically created. If RC extraction tool 222 determines the schematic design is not acceptable, i.e., one or more constraints remain unsatisfied, the RC extraction tool outputs a signal indicating a revised schematic design is required.

Smart dummy cell insertion tool 224 is configured to receive information from LVS tool 212, array edge detection tool 214, layout style tool 216 and error determination tool 220. Smart dummy cell insertion tool 224 is configured to revise the layout design based on the received information. In some embodiments, smart dummy cell insertion tool 224 revises the layout design to add a sufficient number of dummy cells surrounding the active edge cells so the semiconductor device functions properly. In some embodiments, where the layout design includes dummy cells, smart dummy cell insertion tool 224 does not add additional dummy cells. In some embodiments, a number of dummy cells added by smart dummy cell insertion tool 224 is determined by the layout style of the layout design. In some embodiments, smart dummy cell insertion tool 224 adds dummy cells based on errors detected by DRC tool 218.

Figure 3:
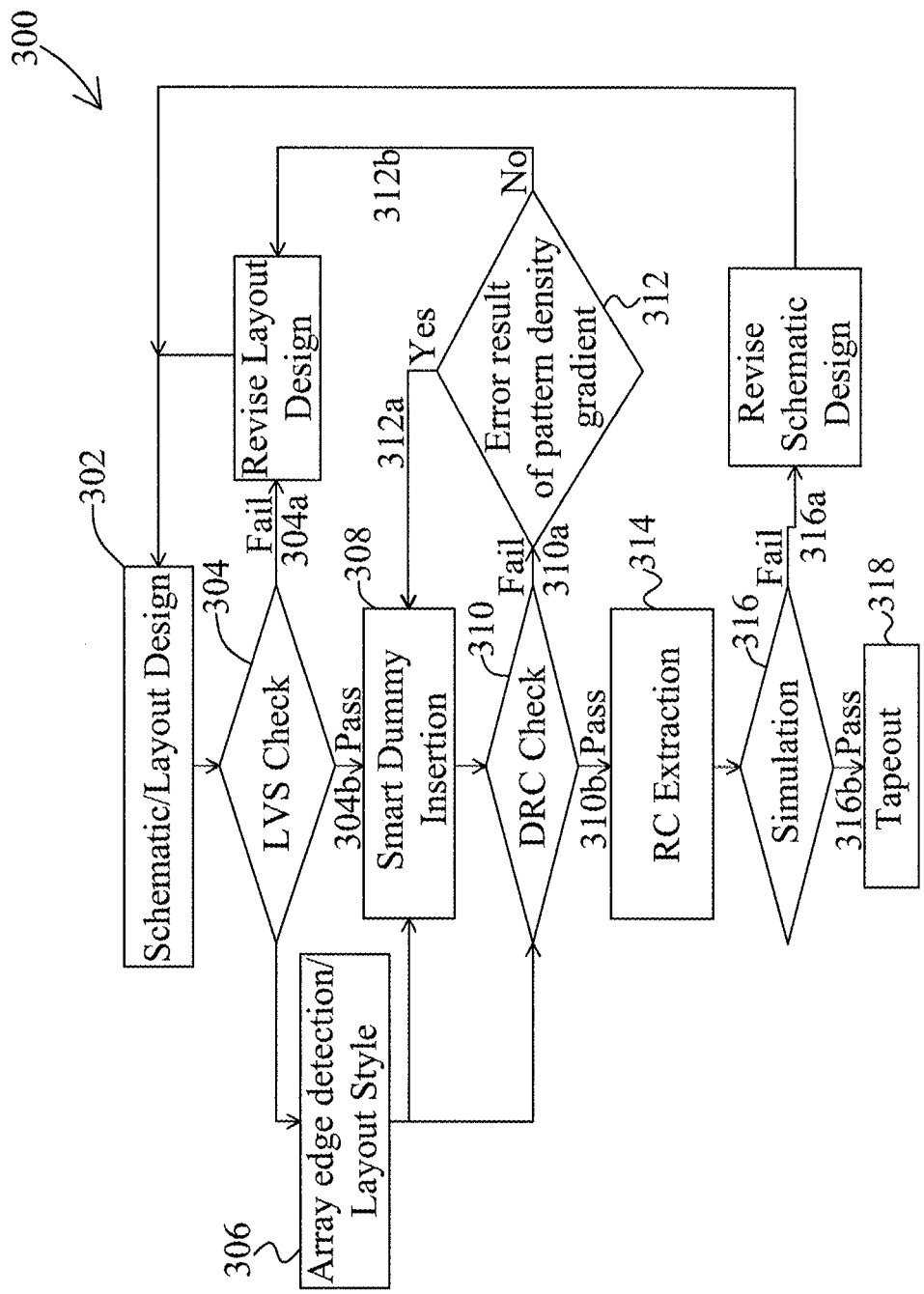
FIG. 3 is a flowchart of a method of making a semiconductor device according to one or more embodiments.

FIG. 3 is a flowchart of a method 300 of making a semiconductor device. Method 300 begins with operation 302, in which a schematic design and a layout design are generated. In some embodiments, the schematic design is created using a computer aided design (CAD) program. In some embodiments, the layout design includes a mask used for forming the features of the schematic design. In some embodiments, the layout design includes more than one mask.

In operation 304, LVS tool 212 performs an LVS check which determines whether the layout design corresponds to the schematic design. LVS tool 212 compares whether elements of the schematic design are accurately incorporated into the layout design. LVS tool 212 compares dimensions and location of features of the schematic design to dimensions and location of features on the layout design. By comparing the schematic design to the layout design, LVS tool 212 is able to determine whether the layout design incorporates all features of the schematic design and whether the features are precisely incorporated into the layout design.

If LVS tool 212 determines the layout design does not accurately correspond to the schematic design, LVS tool 212 transmits a signal as indicated by Fail alerting a layout designer to revise the layout design in operation 305. In operation 305, the design engineer revises the layout design. From operation 305, the method 300 returns to operation 302, and continues therefrom. In operation 304, however, if LVS tool 212 determines the layout design accurately corresponds to the schematic design, the layout design and schematic design information are transmitted as indicated by Pass to operations 306 and 308.

In operation 306, layout style tool 216 determines whether cells along an exterior edge of the semiconductor device are configured in a distributed layout style. The layout style is determined by how the fingers of an active cell are electrically connected to receive an operating voltage. In some embodiments, layout style tool 216 examines an interconnect structure of the layout design to determine how fingers within the cells are electrically connected to one another. In some embodiments, layout style tool 216 determines whether the active edge cells include the distributed layout style.

Also in operation 306, array edge detection tool 214 determines whether the semiconductor device includes dummy cells along an exterior edge of the semiconductor device. In some embodiments, array edge detection tool 214 comprises a computer aided design (CAD) program for recognizing the type of cells along an exterior edge of the layout design. The CAD program uses the schematic design to determine which cells are used for carrying out the task of the semiconductor device. Cells which are outside the area of cells used for carrying out the task of the semiconductor device are determined to be dummy cells.

The information generated in operation 306 is transmitted to smart dummy insertion operation 308 as well as DRC check operation 310. Operations 308 and 310 both use the information generated in operation 306 to perform their respective functions. In the depicted embodiments, the information generated in operation 306 is transmitted directly to each of smart dummy insertion 308 and DRC check 310 as depicted by two corresponding arrows from operation 306 to operations 308 and 310. In some embodiments, the information generated in operation 306 is transmitted to DRC check 310 via smart dummy insertion 308.

In operation 308, smart dummy cell insertion tool 224 revises the layout design based on the layout design and schematic design received from operation 304, as well as the results of operation 306. A detailed description of the smart dummy insertion operation is provided in the description of FIG. 4 below.

In operation 310, DRC tool 218 determines whether the layout design satisfies specified design rules by performing the DRC check. DRC tool 218 examines each side of the semiconductor device from an edge active cell to an outside edge of the semiconductor device. In some embodiments, a distance between the edge active cell and the outside edge is less than or equal to about 6 μm. By examining a reduced distance from the edge active cell to the outside edge, the time used to perform the design rule check is reduced in comparison with examining an entire semiconductor device.

During the examination, DRC tool 218 determines whether the pattern density gradient is below a threshold value at the edge active cell. In some embodiments, the threshold value is less than about 10% variation across a surface of an active edge cell.

In operation 310, if DRC tool 218 determines the layout design fails to satisfy a design rule, then method 300 continues with operation 312 as indicated by Fail. In operation 312, error determination tool 220 determines whether the error is a result of the pattern density gradient exceeding the threshold value. Error determination tool 120 receives the error signal from DRC tool 218 indicating an error and the reason for the error. Error determination tool 220 analyzes the signal from DRC tool 218 to determine whether the error was caused by the pattern density gradient. In operation 312, if the error was a result of the pattern density gradient exceeding the threshold value, the layout design is transmitted as indicated by Yes to operation 308, and the method 300 continues therefrom. In operation 312, however, if the error was not a result of the pattern density gradient, a message is transmitted as indicated by No to operation 305 instructing the layout designer to revise the layout design. The method 300 then continues therefrom as explained above.

In operation 310, however, if DRC tool 218 determines the layout design satisfies the design rules, the method 300 continues to operation 314 as indicated by Pass. In operation 314, RC extraction tool 222 extracts information related to component size, shape, material and spacing from the layout design. In some embodiments, RC extraction tool 222 extracts data using a CAD program. In some embodiments, RC extraction tool 222 extracts data based on coloring information, such as metal layer number, mask number or other suitable information. This information is used to perform a simulation in operation 316.

In operation 316, a simulation is performed based on the information extracted by RC extraction tool 222. In some embodiments, the simulation is performed by RC extraction tool 222. During the simulation, resistance and capacitance values are compared to acceptable performance values. If the simulation determines the resistance and capacitance values of the layout design and the schematic design are within acceptable performance values, i.e., constraints imposed by the circuit designer are satisfied, the method continues to tapeout operation 318 as indicated by Pass. In some embodiments, the schematic design and layout design are transmitted from operation 316 and prepared for pre-production processing in tapeout operation 318. In some embodiments, the schematic design and layout design are prepared for manufacturing by taping out the layout design. In operation 316, however, if the simulation results are not within the acceptable performance values, i.e., one or more of the constraints imposed by the circuit designer are not satisfied, a message is transmitted to operation 317 as indicated by Fail to instruct the circuit designer to revise the schematic design. In operation 317, the circuit designer revises the schematic design, and the method 300 continues to operation 302 and proceeds accordingly.

Figure 4:
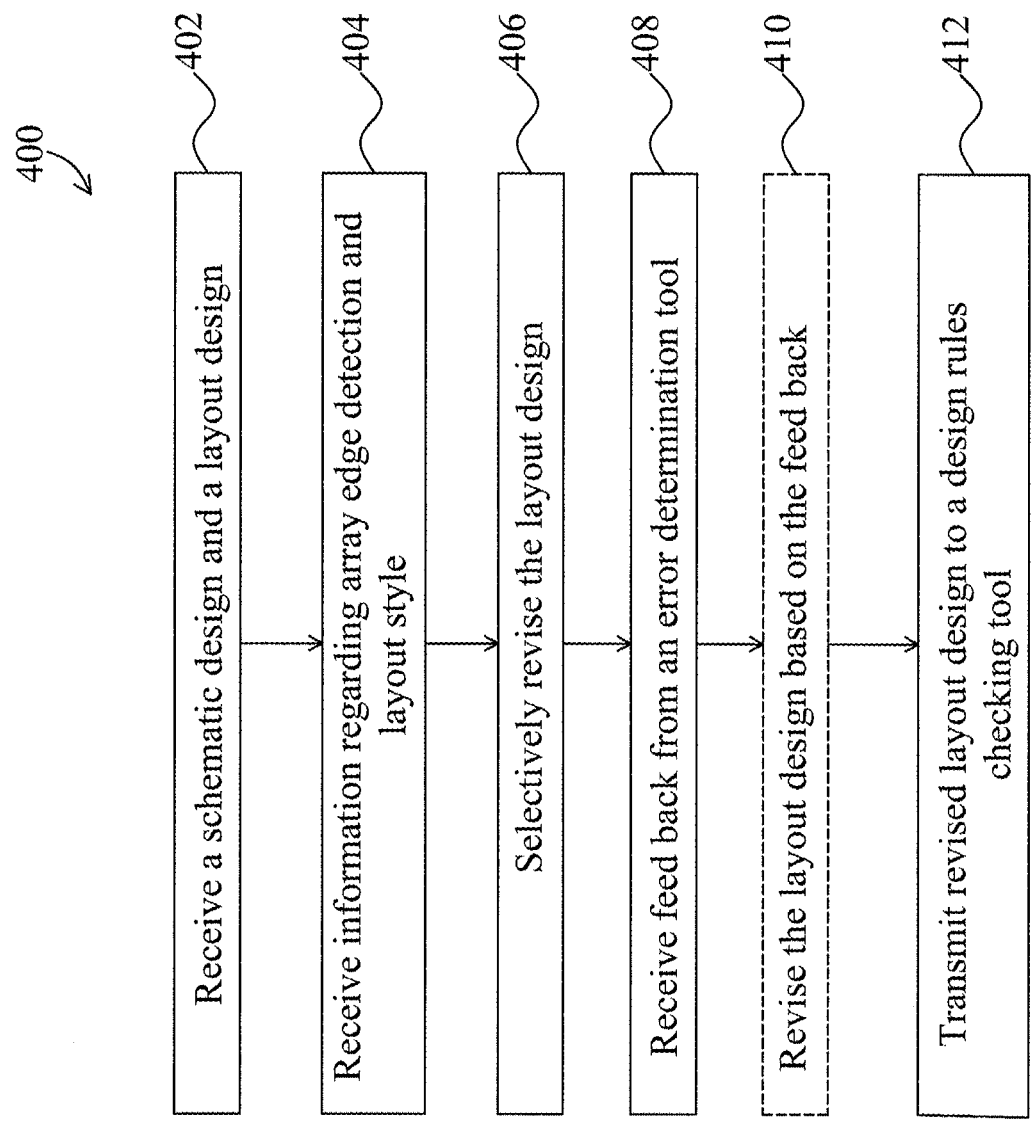
FIG. 4 is a flowchart of a method of performing smart dummy cell insertion.

FIG. 4 is a flowchart of a method 400 for smart dummy insertion in operation 308 in FIG. 3. In operation 402, a layout design and a schematic design are received. In some embodiments, smart dummy insertion tool 224 receives the layout design and the schematic design from LVS tool 212.

In operation 404, information regarding array edge detection and an array edge layout style are received. In some embodiments, the results regarding array edge detection are received from array edge detection tool 214. In some embodiments, smart dummy insertion tool 224 receives results regarding array edge layout style from layout style tool 216.

In operation 406, the layout design is selectively revised by the smart dummy cell insertion tool 224. If the semiconductor device does not include dummy cells, additional dummy cells are added surrounding the exterior edge of the semiconductor device. In some embodiments, the additional dummy cells include a single row of dummy cells surrounding the semiconductor device. If the semiconductor device includes dummy cells, additional dummy cells are not added to the layout design.

In some embodiments, if the semiconductor device includes dummy cells and the array edge includes the distributed layout style, a width of a buffer zone around the semiconductor device is reduced. In some embodiments, a total width of the buffer zone inclusive of the dummy cells is less than or equal to about 6 μm.

In operation 408, smart dummy insertion tool 224 receives feedback from error determination tool 220.

In operation 410, the layout design is revised based on the feedback from error determination tool 220. If DRC tool 218 detects an error based on pattern density gradient problems, error determination tool 220 provides instructions for adding dummy cells to the layout design. In some embodiments, operation 410 is not executed if DRC tool 218 does not detect an error.

In operation 412, the revised layout design is transmitted to DRC tool 218.

By using the above described system and method, a size of the semiconductor device is decreased in comparison with other techniques. The decreased size of the semiconductor device reduces wasted space on a chip and facilitates the fabrication of smaller devices. For example, semiconductor devices manufactured using other techniques have a buffer zone width of approximately 20 μm. Whereas, the present disclosure includes semiconductor devices which have a buffer zone width of less than or equal to about 6 μm. The smaller buffer zone reduces the size of the chip and helps to decrease the overall size of the semiconductor device. The smaller buffer zone also helps to reduce calculation time during analysis of the semiconductor device because a smaller distance is examined by DRC tool 218.

Further, using additional information during the insertion of dummy cells reduces a number of repetitions of the method 300 in comparison with methods which do not combine the information from the LVS tool 212 and the DRC tool 218 into the dummy cell insertion operation. In methods which do not include the feedback information from error determination tool 220, a trial and error method is used to determine whether additional dummy cells are necessary to manufacture a semiconductor device which functions as designed. The trial and error process increases the time required for designing the semiconductor device. In some instances, the trial and error process results in the semiconductor device having a size larger than necessary to function properly.

In addition, the use of active edge cell location detection by array edge detection tool 214 and layout style information from layout style tool 216 in accordance with various embodiments of the disclosure reduces an amount of buffer zone examined by DRC tool 218. Further, the active edge cell location and layout style information reduces the risk of adding additional dummy cells in situations where the circuit designer or layout designer already included dummy cells in the design. By using the active edge cell location and layout style information, the overall size of the semiconductor device is minimized.

One aspect of this description relates to a semiconductor device. The semiconductor device includes an edge active cell, an inner active cell and a middle active cell. The edge active cell is located near an edge of the semiconductor device, wherein the edge active cell includes a plurality of fingers. The inner active cell is adjacent to the edge active cell toward a central portion of the semiconductor device, wherein the inner active cell includes a plurality of fingers and at least one of the plurality of fingers of the edge active cell is electrically connected to at least one of the plurality of fingers of the inner active cell. The middle active cell is located near the central portion of the semiconductor device, wherein the middle active cell includes a plurality of fingers and each of the fingers of the middle active cell are electrically connected to each other.

Another aspect of this description relates to a system for manufacturing a semiconductor device. The system includes an array edge detection tool, a layout style determination tool, a layout versus schematic (LVS) tool and a dummy insertion tool. In some embodiments, the array edge detection tool is configured to determine whether a layout design of the semiconductor device includes a plurality of active cells or at least one dummy cell. In some embodiments, the layout style determination tool is configured to detect whether the plurality of active cells have a distributed layout style. In some embodiments, the LVS tool is configured to compare a schematic design of the semiconductor device to the layout design of the semiconductor device. In some embodiments, the dummy insertion tool is configured to revise the layout design of the semiconductor device based on the layout design and the schematic design by revising an area of the at least one dummy cell when the array edge detection tool determines that the layout design includes the at least one dummy cell, or inserting the at least one dummy cell between the plurality of active cells and an outside edge of the semiconductor device when the array edge detection tool determines that the layout design does not include the at least one dummy cell.

Still aspect of this description relates to a method of making a semiconductor device. The method includes determining if a first cell of a layout design of the semiconductor device and a second cell of the layout design of the semiconductor device have a distributed layout style that a plurality of electrically coupled gate electrode fingers are distributed in the first cell and the second cell, the first cell being on an edge of a cell array, and the second cell being adjacent to the first cell and away from the edge of the cell array. The method further includes determining if the layout design of the semiconductor device comprises a buffer zone outside of the cell array adjacent to the edge, the buffer zone comprising one or more dummy cells, modifying the layout design by inserting the buffer zone outside of the cell array adjacent to the edge if determined that the layout design does not include the buffer zone, performing a design rule check on the modified layout design, wherein at least one of the operations is performed by a computer. The method further includes fabricating the semiconductor device circuit based on the modified layout design.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A system for manufacturing a semiconductor device comprising:
an array edge detection tool configured to determine whether a layout design of the semiconductor device includes a plurality of active cells or at least one dummy cell;
a layout style determination tool configured to detect whether the plurality of active cells have a distributed layout style;
a layout versus schematic (LVS) tool configured to compare a schematic design of the semiconductor device to the layout design of the semiconductor device; and
a dummy insertion tool configured to revise the layout design of the semiconductor device based on the layout design and the schematic design by revising an area of the at least one dummy cell when the array edge detection tool determines that the layout design includes the at least one dummy cell, or inserting the at least one dummy cell between the plurality of active cells and an outside edge of the semiconductor device when the array edge detection tool determines that the layout design does not include the at least one dummy cell.

2. The system of claim 1, wherein
the layout style determination tool configured to detect whether the plurality of active cells have the distributed layout style comprises the layout style determination tool being configured to examine an interconnect structure of the layout design.

3. The system of claim 1, further comprising:
a resistance-capacitance extraction tool configured to perform a resistance-capacitance extraction based on the layout design of the semiconductor device.

4. The system of claim 1, further comprising:
a design rule checking tool configured to determine whether the layout design of the semiconductor device satisfies at least one design rule.

5. The system of claim 4, further comprising:
an error detection tool configured to receive an error signal from the design rule checking tool, and to determine whether the error signal corresponds to a pattern density gradient being greater than a threshold.

6. The system of claim 5, wherein
the error detection tool is configured to send a message to the dummy insertion tool to revise the area of the at least one dummy cell when the error signal corresponds to the pattern density gradient being greater than the threshold.

7. The system of claim 5, wherein
the dummy insertion tool is configured to receive a set of signals from the layout style determination tool, the array edge detection tool, and the error detection tool to selectively revise the area of the at least one dummy cell in the layout design of the semiconductor device.

8. A system for manufacturing a semiconductor device comprising:
an array edge detection tool configured to determine whether a first layout design of the semiconductor device includes a set of active cells or a set of dummy cells;
a layout versus schematic (LVS) tool configured to compare a schematic design of the semiconductor device to the first layout design of the semiconductor device; and
a dummy insertion tool configured to generate a second layout design of the semiconductor device based on the first layout design and the schematic design by revising a region of the set of dummy cells when the array edge detection tool determines that the first layout design includes the set of dummy cells, or inserting the set of dummy cells between the set of active cells and an outside edge of the semiconductor device when the array edge detection tool determines that the first layout design does not include the set of dummy cells.

9. The system of claim 8, further comprising:
a design rule checking tool configured to determine whether the first layout design of the semiconductor device satisfies at least one design rule.

10. The system of claim 9, further comprising:
an error detection tool configured to receive an error signal from the design rule checking tool, and to determine whether the error signal corresponds to a pattern density gradient being greater than a threshold.

11. The system of claim 10, wherein
the error detection tool is configured to send a message to the dummy insertion tool to revise the region of the set of dummy cells when the error signal corresponds to the pattern density gradient being greater than the threshold.

12. The system of claim 11, wherein the threshold is about 10%.

13. The system of claim 12, wherein
the dummy insertion tool is configured to receive a set of signals from at least one of the array edge detection tool, or the error detection tool to selectively revise the region of the set of dummy cells in the first layout design of the semiconductor device.

14. The system of claim 8 further comprising:
a resistance-capacitance extraction tool configured to perform a resistance-capacitance extraction based on the first layout design of the semiconductor device.

15. A system for manufacturing a semiconductor device comprising:
a layout style determination tool configured to detect whether a plurality of active cells have a distributed layout style;

a layout versus schematic (LVS) tool configured to compare a schematic design of the semiconductor device to a layout design of the semiconductor device; and a dummy insertion tool configured to revise the layout design of the semiconductor device based on the layout design and the schematic design by revising an area of at least one dummy cell when the layout design includes the at least one dummy cell, or inserting the at least one dummy cell between the plurality of active cells and an outside edge of the semiconductor device when the layout design does not include the at least one dummy cell; and a resistance-capacitance extraction tool configured to perform a resistance-capacitance extraction based on the layout design of the semiconductor device.

16. The system of claim 15, wherein
the layout style determination tool configured to detect whether the plurality of active cells have the distributed layout style comprises the layout style determination tool being configured to examine an interconnect structure of the layout design.

17. The system of claim 15, further comprising:
a design rule checking tool configured to determine whether the layout design of the semiconductor device satisfies at least one design rule.

18. The system of claim 17, further comprising:
an error detection tool configured to receive an error signal from the design rule checking tool, and to determine whether the error signal corresponds to a pattern density gradient being greater than a threshold.

19. The system of claim 18, wherein
the error detection tool is configured to send a message to the dummy insertion tool to revise the area of the at least one dummy cell when the error signal corresponds to the pattern density gradient being greater than the threshold.

20. The system of claim 18, wherein
the dummy insertion tool is configured to receive a set of signals from at least one of the layout style determination tool or the error detection tool to selectively revise the area of the at least one dummy cell in the layout design of the semiconductor device.

* * * * *